United States Patent
Kull et al.

(10) Patent No.: US 9,461,661 B1
(45) Date of Patent: Oct. 4, 2016

(54) THIRD ORDER HARMONIC DISTORTION CORRECTION CIRCUIT USING A REFERENCE ANALOG DIGITAL CONVERTER

(71) Applicant: International Business Machines Corporation, Armonk, NY (US)

(72) Inventors: Lukas Kull, Thalwil (CH); Danny Chen-Hsien Luu, Bulach (CH); Thomas H. Toifl, Zurich (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/008,733

(22) Filed: Jan. 28, 2016

(51) Int. Cl.
    *H03M 1/10*    (2006.01)
    *H03M 1/38*    (2006.01)

(52) U.S. Cl.
    CPC ............. *H03M 1/1033* (2013.01); *H03M 1/10* (2013.01); *H03M 1/38* (2013.01)

(58) Field of Classification Search
    CPC ....... H03M 1/1033; H03M 1/38; H03M 1/10
    USPC .................................. 341/120, 155
    See application file for complete search history.

(56) References Cited

U.S. PATENT DOCUMENTS

| | | | | |
|---|---|---|---|---|
| 4,612,533 A | * | 9/1986 | Evans .................. | H03M 1/1047 341/120 |
| 6,987,477 B1 | * | 1/2006 | Aude .................. | H03M 1/0695 341/155 |
| 7,109,900 B2 | | 9/2006 | Kiriyama et al. | |
| 7,602,323 B2 | * | 10/2009 | Galton ................ | H03M 1/1004 341/118 |
| 8,106,805 B2 | * | 1/2012 | Lin ..................... | H03M 1/0604 341/120 |
| 8,384,465 B2 | | 2/2013 | Zanchi et al. | |
| 8,497,789 B2 | * | 7/2013 | Meacham ........... | H03M 1/0641 341/118 |
| 2014/0368366 A1 | | 12/2014 | Galton et al. | |

FOREIGN PATENT DOCUMENTS

EP    2302813 A1    3/2011

OTHER PUBLICATIONS

Abe, Fmitaka., "Low-Distortion Signal Generation for ADC Testing," 2014 IEEE, 978-1-4799-4722-5; pp. 1-10.
Gande, Manideep et al., "Blind Background Calibration of Harmonic Distortion Based on Selective Sampling," 2013 IEEE, 978-1-4673-6146; 4 pages.

* cited by examiner

*Primary Examiner* — Brian Young
(74) *Attorney, Agent, or Firm* — Cantor Colburn LLP; David Quinn (57) ABSTRACT

A linear reference analog to digital converter (ADC) network may include a first ADC operatively connected to a first sample and hold circuit. The linear reference ADC network may be configured to receive an input signal from the first sample and hold circuit and sample the input signal with a harmonic distortion. The linear reference ADC network may further include a reference ADC operatively connected to a second sample and hold circuit and configured to receive the input signal and sample the input signal with a second harmonic distortion. The linear reference ADC network may further include a combining module operatively connected to the first ADC and the reference ADC, the combining module configured to equalize a linearity of an output of the first ADC to a linearity of an output of the reference ADC, and output a combined output signal, and a circuit configured to output a calibrated output signal having calibrated harmonic distortion content.

18 Claims, 8 Drawing Sheets

THIRD ORDER HARMONIC DISTORTION CORRECTION CIRCUIT USING A REFERENCE ANALOG DIGITAL CONVERTER

BACKGROUND

The present disclosure relates to harmonic distortion correction circuits, and more specifically, to third-order harmonic distortion correction circuit using a reference analog to digital converter.

High resolution, high speed analog to digital converters (ADCs) may be used in 5G mobile base stations, among other uses. The signal to noise and distortion ratio (SNDR) of high resolution ADCs in systems managing greater than 10 effective number of bits (ENOB) at high sampling rates is often limited by harmonic distortion, because of incomplete settling or nonlinear buffer/amplifier. ADCs at low sampling frequency can make use of feedback to reduce distortion. However this approach may not work with multi-GS/s ADCs.

SUMMARY

According to an embodiment of the present invention, a method for calibrating harmonic distortion is described. The method may include receiving an input signal at a first analog to digital converter (ADC) and a reference ADC, and sampling the input signal at the first ADC and the reference ADC. The sampled input signal may have a harmonic distortion at both of the first ADC and the reference ADC. The method may further include equalizing, with the first ADC and the reference ADC, a linearity of an output of the first ADC to a linearity of an output of the reference ADC, and combining, with a combining module, the output of the first ADC and the output of the reference ADC to form a combined output signal, and outputting a calibrated output signal having calibrated harmonic distortion content.

According to other embodiments, a linear reference analog to digital converter (ADC) network is described. The linear reference ADC network may include a first ADC operatively connected to a first sample and hold circuit. The linear reference ADC network may be configured to receive an input signal from the first sample and hold circuit and sample the input signal with a harmonic distortion. The linear reference ADC network may further include a reference ADC operatively connected to a second sample and hold circuit configured to receive the input signal and sample the input signal with a second harmonic distortion. The linear reference ADC network may further include a combining module operatively connected to the first ADC and the reference ADC, the combining module configured to equalize a linearity of an output of the first ADC to a linearity of an output of the reference ADC, and output a combined output signal, and a circuit configured to output a calibrated output signal having calibrated harmonic distortion content.

According to yet other embodiments, a non-transitory computer-readable storage medium is described. The non-transitory storage medium may include program instructions that are executable by a processor to perform a method for calibrating harmonic distortion. The method may include receiving an input signal at a first analog to digital converter (ADC) and a reference ADC, and sampling the input signal at the first ADC and the reference ADC. The sampled input signal may have a harmonic distortion at both of the first ADC and the reference ADC. The method may further include equalizing, with the first ADC and the reference ADC, a linearity of an output of the first ADC to a linearity of an output of the reference ADC, and combining, with a combining module, the output of the first ADC and the output of the reference ADC to form a combined output signal, and outputting a calibrated output signal having calibrated harmonic distortion content.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
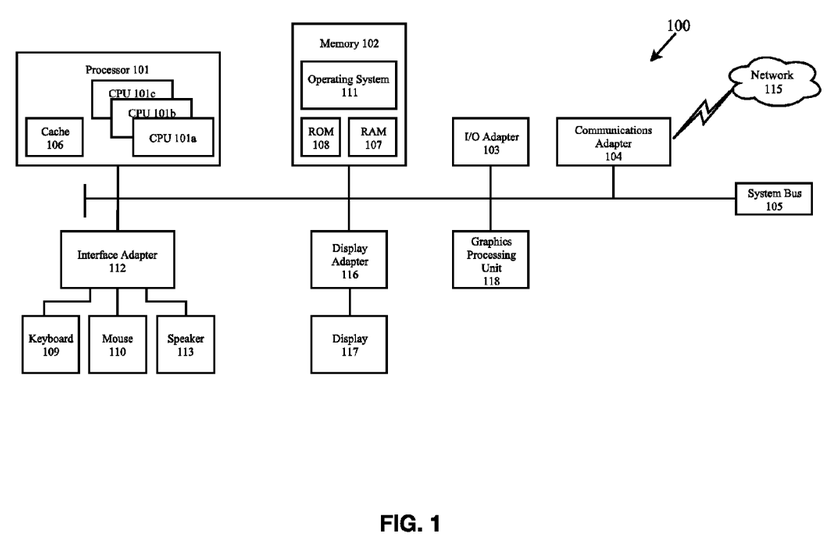
FIG. 1 illustrates a block diagram of a computer system for use in practicing the teachings herein.

An analog to digital converter network may include circuitry in addition to, or as part of a computer system. FIG. 1 illustrates a block diagram of a computer system 100 (hereafter "computer 100") for use in practicing the embodiments described herein. The methods described herein can be implemented in hardware, software (e.g., firmware), or a combination thereof. In an exemplary embodiment, the methods described herein are implemented in hardware, and may be part of the microprocessor of a special or general-purpose digital computer, such as a personal computer, workstation, minicomputer, or mainframe computer. The methods described herein may also be part of any network equipment, laboratory equipment, and/or the like. Computer 100 therefore can embody a general-purpose computer. In another exemplary embodiment, the methods described herein are implemented as part of a mobile device, such as, for example, a mobile phone, a personal data assistant (PDA), a tablet computer, etc.

In an exemplary embodiment, in terms of hardware architecture, as shown in FIG. 1, the computer 100 includes processor 101. Computer 100 also includes memory 102 coupled to processor 101, and one or more input/output adaptors 103 that may be communicatively coupled via system bus 105. Memory 102 may be operatively coupled to one or more internal or external memory devices. Communications adaptor 104 may be operatively connect computer 100 to one or more networks 115. A system bus 105 may also connect one or more user interfaces via interface adaptor 112. Interface adaptor 112 may connect a plurality of user interfaces to computer 100 including, for example, keyboard 109, mouse 110, speaker 113, etc. System bus 105 may also connect display adaptor 116 and display 117 to processor 101. Processor 101 may also be operatively connected to graphical processing unit 118.

Processor 101 is a hardware device for executing hardware instructions or software, particularly that stored in a non-transitory computer-readable memory (e.g., memory 102). Processor 101 can be any custom made or commercially available processor, a central processing unit (CPU), a plurality of CPUs, for example, CPU 101a-101c, an auxiliary processor among several other processors associated with the computer 100, a semiconductor based microprocessor (in the form of a microchip or chip set), or generally any device for executing instructions. Processor 101 can include a memory cache 106, which may include, but is not limited to, an instruction cache to speed up executable instruction fetch, a data cache to speed up data fetch and store, and a translation lookaside buffer (TLB) used to speed up virtual-to-physical address translation for both executable instructions and data. Cache 106 may be organized as a hierarchy of more cache levels (L1, L2, etc.).

Memory 102 can include random access memory (RAM) 107 and read only memory (ROM) 108. RAM 107 can be any one or combination of volatile memory elements (e.g., DRAM, SRAM, SDRAM, etc.). ROM 108 can include any one or more nonvolatile memory elements (e.g., erasable programmable read only memory (EPROM), flash memory, electronically erasable programmable read only memory (EEPROM), programmable read only memory (PROM), tape, compact disc read only memory (CD-ROM), disk, cartridge, cassette or the like, etc.). Moreover, memory 102 may incorporate electronic, magnetic, optical, and/or other types of non-transitory computer-readable storage media. Note that the memory 102 can have a distributed architecture, where various components are situated remote from one another, but can be accessed by the processor 101.

The instructions in memory 102 may include one or more separate programs, each of which comprises an ordered listing of computer-executable instructions for implementing logical functions. In the example of FIG. 1, the instructions in memory 102 may include an operating system 111. Operating system 111 can control the execution of other computer programs and provides scheduling, input-output control, file and data management, memory management, and communication control and related services.

Input/output adaptor 103 can be, for example but not limited to, one or more buses or other wired or wireless connections, as is known in the art. Input/output adaptor 103 may have additional elements, which are omitted for simplicity, such as controllers, buffers (caches), drivers, repeaters, and receivers, to enable communications. Further, the local interface may include address, control, and/or data connections to enable appropriate communications among the aforementioned components.

Interface adaptor 112 may be configured to operatively connect one or more input/output (I/O) devices to computer 100. For example, interface adaptor 112 may connect a keyboard 109 and mouse 110. Other output devices, e.g., speaker 113 may be operatively connected to interface adaptor 112. Other output devices may also be included, although not shown. For example, devices may include but are not limited to a printer, a scanner, microphone, and/or the like. Finally, the I/O devices connectable to interface adaptor 112 may further include devices that communicate both inputs and outputs, for instance but not limited to, a network interface card (NIC) or modulator/demodulator (for accessing other files, devices, systems, or a network), a radio frequency (RF) or other transceiver, a telephonic interface, a bridge, a router, and the like.

Computer 100 can further include display adaptor 116 coupled to one or more displays 117. In an exemplary embodiment, computer 100 can further include communications adaptor 104 for coupling to a network 115.

Network 115 can be an IP-based network for communication between computer 100 and any external device. Network 115 transmits and receives data between computer 100 and devices and/or systems external to computer 100. In an exemplary embodiment, network 115 can be a managed IP network administered by a service provider. Network 115 may be a network internal to an aircraft, such as, for example, an avionics network, etc. Network 115 may be implemented in a wireless fashion, e.g., using wireless protocols and technologies, such as WiFi, WiMax, etc. Network 115 may also be a wired network, e.g., an Ethernet network, an ARINC 429 network, a CAN, etc., having any wired connectivity including, e.g., an RS232 connection, R5422 connection, etc. Network 115 can also be a packet-switched network such as a local area network, wide area network, metropolitan area network, Internet network, or other similar type of network environment. The network 115 may be a fixed wireless network, a wireless local area network (LAN), a wireless wide area network (WAN) a personal area network (PAN), a virtual private network (VPN), intranet or other suitable network system.

If computer 100 is a PC, workstation, laptop, tablet computer and/or the like, the instructions in the memory 102 may further include a basic input output system (BIOS) (omitted for simplicity). The BIOS is a set of essential routines that initialize and test hardware at startup, start operating system 111, and support the transfer of data among the operatively connected hardware devices. The BIOS is stored in ROM 108 so that the BIOS can be executed when computer 100 is activated. When computer 100 is in operation, processor 101 may be configured to execute instructions stored within the memory 102, to communicate data to and from the memory 102, and to generally control operations of the computer 100 pursuant to the instructions.

Third order harmonic distortion is often the most significant spur in a differential ADC design. Third order harmonic distortion can originate from signal sampling at both low frequencies and high frequencies. High frequency sampling tends to have more pronounced distortion than lower frequency sampling. In most cases, the distortion comes mainly from input buffer and sampling switch (the non-linear sampling switch). Improving the distortion usually means adding more power to the input buffer as bias current, or by using a bootstrapped switch. These types of conventional solutions may add unnecessary complexity to ADC systems. In some instances, by using a small input signal to reduce distortion, the ADC may become noise limited. Improving a noise limited design generally means quadrupling the power for each additional bit of effective resolution. Thus, using a small input signal may not, by itself, be an optimal solution.

Other conventional methods have included measuring input/output characteristics for every chip, and making the corrections manually. However, this approach is generally inefficient for complex systems. Other methods may include statistics-based calibration algorithms, but these types of algorithms may take a relatively long time to converge and may be highly dependent on an operator's knowledge of the statistics of the input signals. Reference ADCs may sometimes be used to calibrate inter-stage gain errors and offsets of pipelined ADCs. However, this approach may not correct capacitor mismatch in successive approximation (SAR) ADCs.

Figure 2:
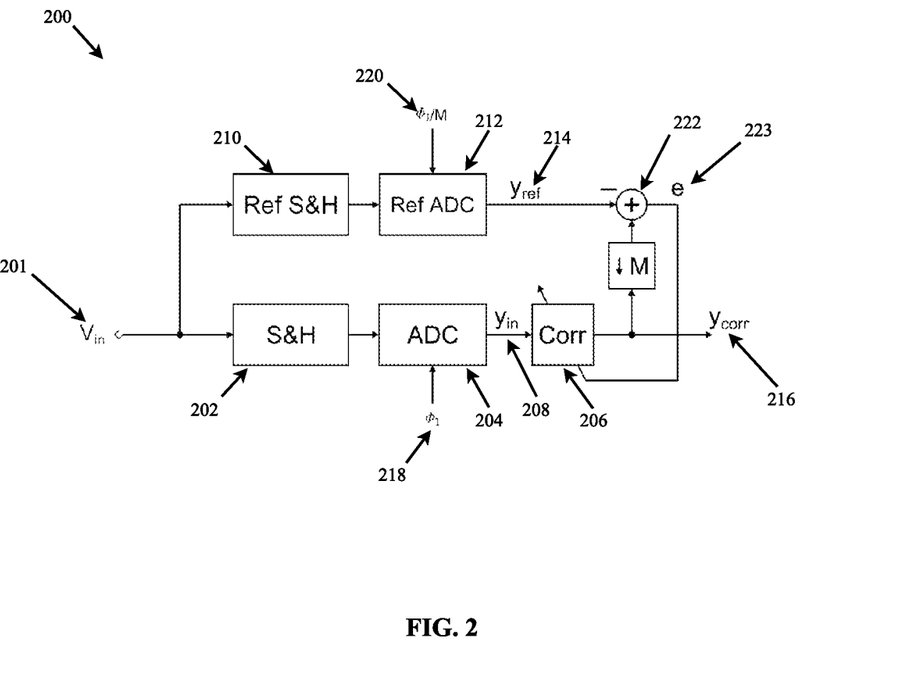
FIG. 2 depicts a block diagram of an ADC network with adaptive correction in accordance with an exemplary embodiment.

Accordingly, it may be advantageous to provide a non-linear ADC calibrated with a slow, but more linear, reference ADC. While this approach may provide more signal noise, the noise can be removed using an averaging filter in the digital domain implemented through a processor. According to some disclosed embodiments, it may be possible to calibrate other types of mismatch such as gain mismatch, bandwidth mismatch, and timing mismatch. FIG. 2 depicts an exemplary circuit diagram of an analog digital converter (ADC) network 200, in accordance with some embodiments.

Referring now to FIG. 2, ADC network 200 may include a sample and hold circuit 202, an analog digital converter (ADC) (hereafter "first ADC 204") connected to sample and hold circuit 202. ADC network 200 may further include a combining module 222, that may be configured to combine output signals 208 and 214, and a corrective module 206 which may be configured to receive a combined digital input signal from combining module 222. Corrective module 206 may correct the output signal 208 and output corrected output 216 by removing signal noise from the combined output signal 223.

Now considering ADC network 200 in greater detail, according to some embodiments, sample and hold circuit 202 may receive an analog input signal 201, sample the signal at a predetermined sampling rate, and forward the sampled signal to first ADC 204. The output 208 of sample and hold circuit 202 may include uncalibrated harmonic distortion content. More particularly, according to some embodiments, the uncalibrated harmonic distortion content may include a third harmonic from sample and hold circuit 202, which may be a result of the sampling process. In some aspects, the noise and distortion may arise from one or both of the sample and hold circuit 202 and the input buffer (not shown). In some embodiments, first ADC 204 may be configured to receive the sampled output of sample and hold circuit 202, convert the sample to the digital domain, and forward output signal 208 to a corrective module 206.

Reference sample and hold circuit 210 may sample at the same clock timing as sample and hold circuit 202. The output of reference sample and hold circuit 210 may have a different linearity than the output of sample and hold circuit 202. For example, if first ADC 204 operates at a first predetermined sample rate 218, reference ADC 212 may be configured to operate at a reference predetermined sample rate 220, which may be first predetermined sample rate 218 divided by downsampling factor of M.

Accordingly, reference sample and hold circuit 210 may be more linear than the output of sample and hold circuit 202. In some embodiments, an increased linearity of output signal 214 may come at a cost of a higher level of signal noise, for example, in the form of thermal (kT/C) signal noise. In some aspects, kT/C noise describes the total thermal noise power added to a signal when a sample is taken on a capacitor.

Reference ADC 212 may be configured to receive the sampled output of sample and hold circuit 210, convert the sample to the digital domain, and forward output signal 214 to combining module 222.

The linearity of reference ADC 212 may be increased in a plurality of ways. For example, in some embodiments, reference ADC 212 may be a successive approximation (SAR) ADC. An SAR is a type of analog digital converter that converts a continuous analog waveform into a discrete digital representation via a binary search through a plurality of quantization levels before finally converging upon a digital output for each conversion.

According to other embodiments, reference ADC 212 may be configured for dynamic element matching to increase linearity of the reference ADC. By configuring reference ADC 212 for dynamic element matching (DEM), ADC network 200 may remedy component mismatch errors. DEM is a dynamic process that reduces the effects of component mismatches in electronic circuits with dynamic rearrangement of the interconnections of mismatched components so that the time averages of the equivalent components at each of the component positions are equal or nearly equal. By appropriately varying the mismatched components' virtual positions, ADC network 200 may mitigate the effects of mismatched components with mismatch reduction via frequency shifting, or mismatch elimination.

In some embodiments, combining module 222 may be configured to combine output 214 and output 208, equalize a linearity of outputs 214 and 208, and output a combined output signal, which may be fed into corrective module 206. In some embodiments, network 200 may embody corrective module 206 as a processor configured to filter a kT/C signal noise from the combined output signal.

Figure 3:
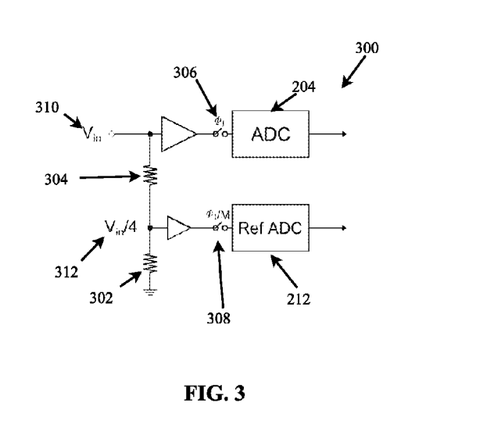
FIG. 3 depicts a circuit diagram of an ADC circuit with an input signal network in accordance with an exemplary embodiment.

According to some embodiments, ADC network 200 may divide analog input signal 201 before forwarding the divided signal to reference sample and hold circuit 210. By dividing the signal with an input signal network, ADC network 200 may provide an enhanced signal having less signal distortion. FIG. 3 depicts a circuit diagram of an ADC circuit 300 having an input signal network, in accordance with an exemplary embodiment.

Referring now to FIG. 3, ADC circuit 300 is depicted with input signal 310 feeding a predetermined voltage to both of first ADC 204 and reference ADC 212 via a plurality of resistors 304 and 312. According to some embodiments, resistors 304 and 312 may be configured to have a predetermined relationship to each other. For example, reference signal 312, which is an input to reference ADC 212, may be half the voltage of input signal 310, which is an input to first ADC 204. In some embodiments, reference ADC 212 may be configured to operate on a reduced voltage input, as described above with respect to FIG. 2. Accordingly, the output of reference ADC 212 may include a greater linearity than the output of first ADC 204.

Figure 4:
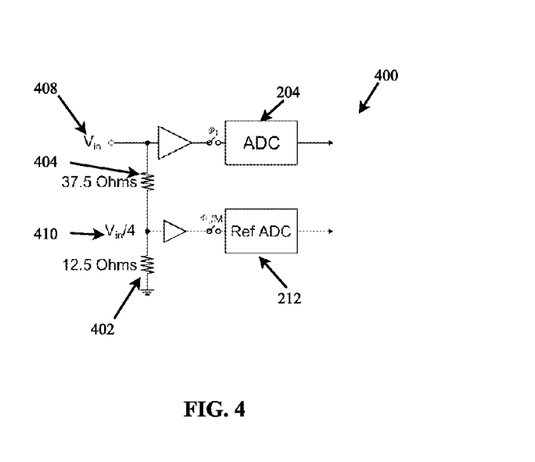
FIG. 4 depicts a circuit diagram of an ADC circuit with an input signal network in accordance with an exemplary embodiment.

As shown in FIG. 4, for example, ADC circuit 400 is depicted, in accordance with some embodiments. Resistor 404 may be configured as 37.5 Ohms, where reference ADC resistor 402 may be configured as 12.5 Ohms. In some aspects, resistor 404 may be configured to provide reference signal 410 as ¼th of the voltage at input 408. While the resistances shown with respect to FIG. 4 depict one possible predetermined relationship (having respective voltage outputs of 1 to ¼, respectively), it is contemplated that other resistor relationships may be desirable. For example, the relationship between resistors 302 and 304 may be ⅓, ⅕, etc., and may be optimized based on a particular application requirement, and the trade-off between linearity and signal noise associated with the differential resistance. Moreover, sample rates depicted with respect to switch 306, operating at rate 218 may be configured to sample at a faster rate than switch 308, which may be configured at a rate 220. As earlier described, reference ADC 212 may operate at a lower sampling rate than the first ADC by a predetermined down-sampling factor "M".

Figure 5:
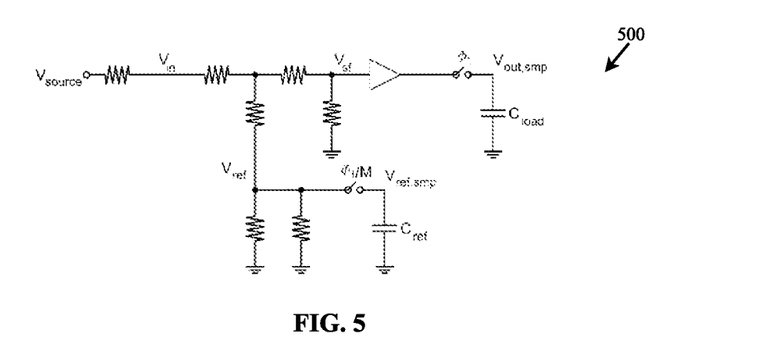
FIG. 5 depicts a circuit diagram of a resistive divider network in accordance with an exemplary embodiment.
Figure 6:
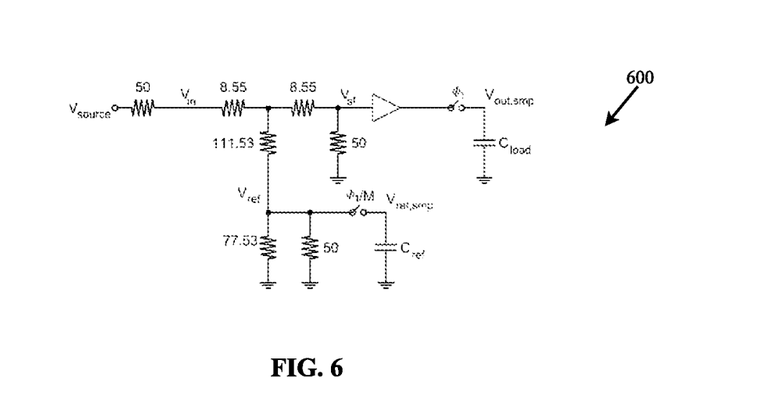
FIG. 6 depicts a circuit diagram of a resistive divider network in accordance with an exemplary embodiment.

Other configurations for a resistive divider network are contemplated. For example, FIG. 5 depicts a circuit diagram of a resistive divider network 500 in accordance with an exemplary embodiment. Referring to FIG. 5, resistive divider network 500 may include a plurality of resistors configured to mitigate signal loss while providing adequate signal isolation. FIG. 6. depicts one possible configuration of resistor values resulting in a resistive divider matched to 50 Ohm. According to the configuration of FIG. 6, signal loss with respect to $V_{sf}/V_{in}$ may be roughly −3 dB. Moreover, the configuration of FIG. 6 may produce a signal loss with respect to $V_{ref}/V_{in}$ roughly equal to −15 db. With the configuration of resistor divider network 600, a resultant voltage isolation with respect to $V_{sf}/V_{ref}$ may be roughly −15 dB.

Figure 7:
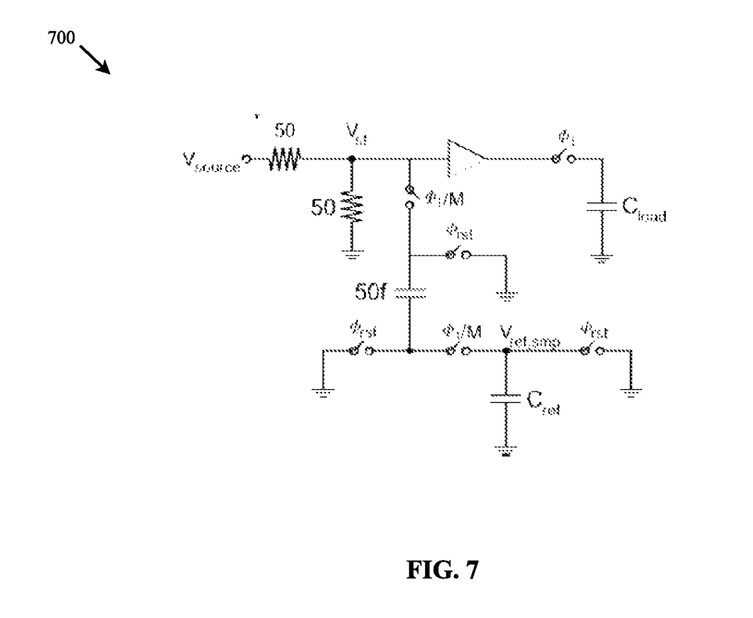
FIG. 7 depicts a circuit diagram of a capacitive divider network in accordance with an exemplary embodiment.

According to yet other configurations, various capacitive divider networks are also contemplated. For example, FIG. 7 depicts a circuit diagram of a capacitive divider network 700, in accordance with an exemplary embodiment. Referring now to FIG. 7, exemplary capacitive network 700 may divide input voltage $V_{sf}$ from the input voltage $V_{ref}$ without voltage isolation.

Figure 8:
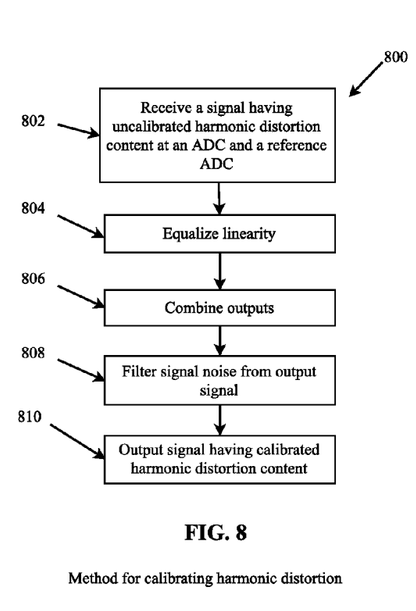
FIG. 8 depicts a flow diagram of a method for calibrating harmonic distortion in accordance with an exemplary embodiment.

FIG. 8 depicts a flow diagram of a method 800 for calibrating harmonic distortion, in accordance with an exemplary embodiment. Referring now to FIG. 8, as shown in block 802, ADC network 200 may receive, at a first analog digital converter (ADC) and a reference ADC, an analog input signal 201 having uncalibrated harmonic distortion content. As shown in block 804, ADC network 200 may equalize, with the first ADC 204 and reference ADC 212, a linearity of an output 208 of first ADC 204 to an output 214 of reference ADC 212. Next, ADC network 200 may be configured to combine, with combining module 222, output 208 of first ADC 204 and output 214 of reference ADC 212 to form a combined output signal, as shown in block 806. According to some embodiments, as shown in block 808, ADC network 200 may filter, with a processor, a thermal (kT/C) signal noise from the combined output signal. As shown in block 810, ADC network 200 may output calibrated output 216. Calibrated output 216 may have calibrated harmonic distortion content.

Figure 9:
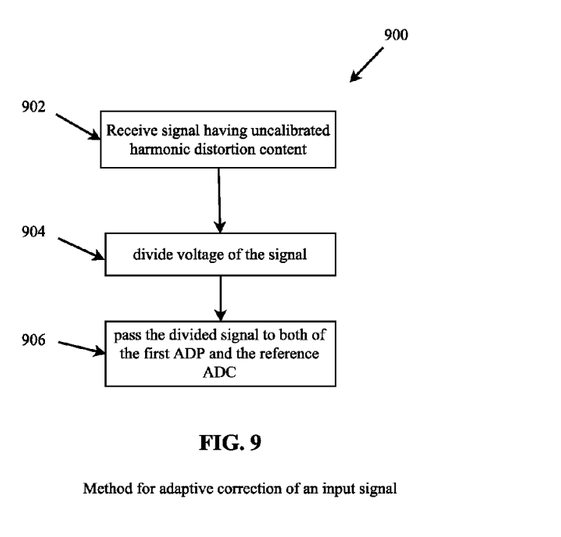
FIG. 9 depicts a flow diagram of a method for adaptive correction of an input signal having harmonic distortion content.

FIG. 9 depicts a flow diagram of a method 900 for adaptive corrective of an input signal, according to some embodiments. As shown in block 902, ADC network 200 may receive, at an adaptive correction circuit, a signal having uncalibrated harmonic distortion content. For example, FIGS. 3, 4, 5, 6, and/or 7 depict various divider networks that may be functional as adaptive corrective circuits, according to some embodiments. As shown in block 904, ADC network 200 may divide a voltage of the signal having uncalibrated harmonic distortion content, and as shown in block 906, pass the signal having uncalibrated harmonic distortion content to both of the first ADC and the reference ADC, where the adaptive correction circuit may reduce a distortion of the signal having uncalibrated harmonic distortion content.

Figure 10:
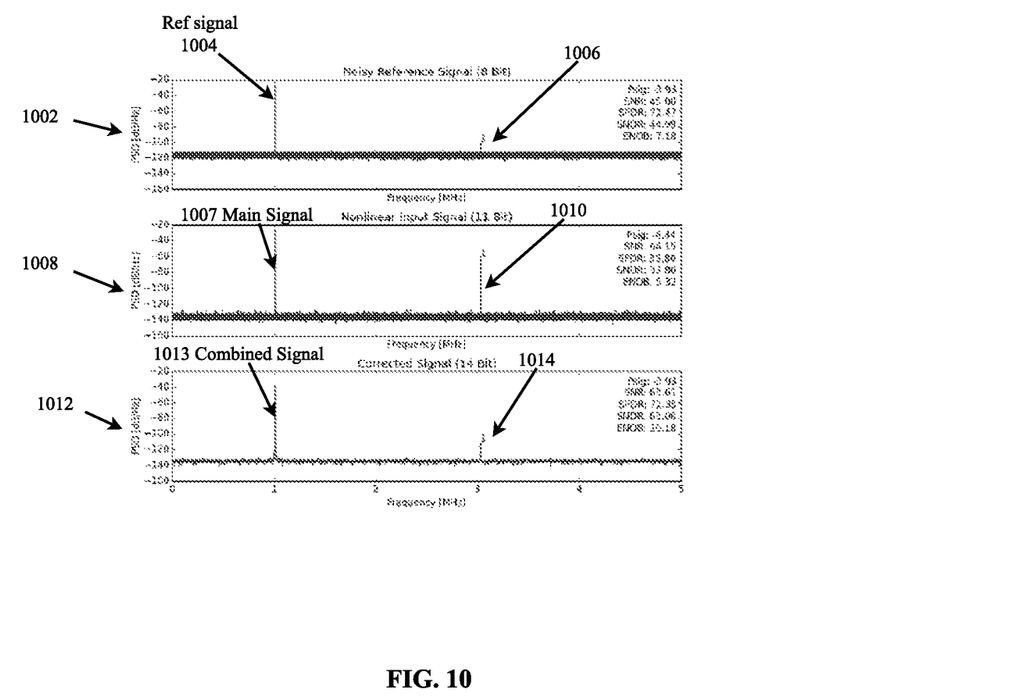
FIG. 10 depicts a plurality of Fast Fourier Transformation (FFT) plots, in accordance with an exemplary embodiment.

FIG. 10 depicts a plurality of Fast Fourier Transformation (FFT) plots, in accordance with an exemplary embodiment. Referring to FIG. 10, FFT plot 1002 depicts ADC output distortion 1006 in reference signal 1004, according to some embodiments. As shown in FFT plot 1002, output 214 (depicted in graph 1002 as reference signal 1004) may be relatively linear but noisy in comparison with output 208. As shown in plot 1008, a FFT of output 208 of first ADC 204 is shown (depicted as main signal 1007), having distortion 1010 that is relatively higher than distortion 1006. However, signal noise ENOB is significantly lower than that shown in FFT plot 1002. Finally, FFT plot 1012 depicts combined signal 1013, which may correspond to output 216, having relatively low distortion 1014 and relatively high linearity in comparison with individual components (output signals 208 and 214).

Figure 11:
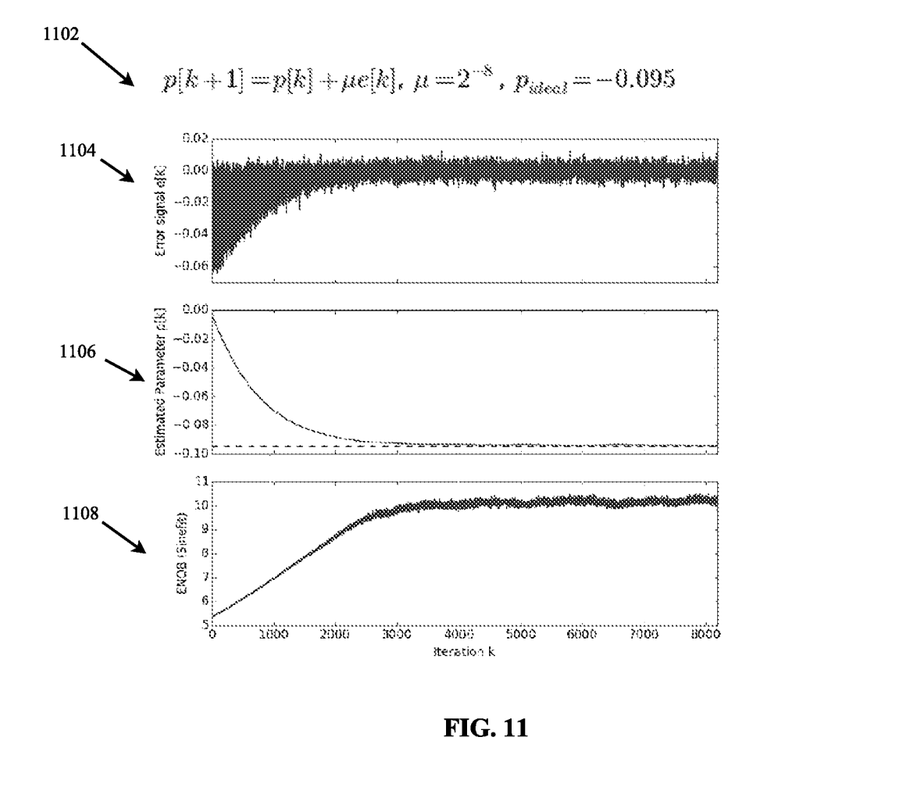
FIG. 11 depicts an error estimation algorithm with plots of ADC output error, in accordance with an exemplary embodiment.

FIG. 11 depicts an error estimation algorithm 1102, with plots of ADC output errors 1104, 1106, and 1108, in accordance with an exemplary embodiment. According to some embodiments, ADC network 200 may include a non-transitory computer readable storage medium with computer-executable instructions that, when executed, cause a processor to perform method 800. In particular, the processor may be configured to filter a thermal (kT/C) signal noise from the combined output signal using, among other things, exemplary error estimation algorithm 1102, and output a calibrated output signal having calibrated harmonic distortion (as shown in plot 1104). As shown in plot 1106, according to some embodiments, linearity of ADC network 200 may settle around a few thousand iterations. As depicted in 1108, output 216 of ADC network 200 may grow in linearity with each subsequent iteration, until the linearity becomes generally stable around a few thousand iterations.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for calibrating harmonic distortion comprising:
   receiving an input signal at a first analog to digital converter (ADC) and a reference ADC;
   sampling the input signal at the first ADC and the reference ADC with a harmonic distortion at both of the first ADC and the reference ADC;
   equalizing, with the first ADC and the reference ADC, a linearity of an output of the first ADC to a linearity of an output of the reference ADC;
   combining, with a combining module, the output of the first ADC and the output of the reference ADC to form a combined output signal; and outputting a calibrated output signal having calibrated harmonic distortion content, wherein the output of the reference ADC has greater linearity than the output of the first ADC.

2. The method of claim 1, wherein the uncalibrated harmonic distortion content is a third harmonic.

3. The method of claim 1, further comprising correcting, with the first ADC and the reference ADC, a channel mismatch between the first ADC and the reference ADC.

4. The method of claim 1, wherein the output of the reference ADC comprises a thermal (kT/C) noise level greater than a thermal (kT/C) signal noise level of the output of from the first ADC.

5. The method of claim 1, wherein the reference ADC has a lower sampling rate than the first ADC by a predetermined downsampling factor.

6. The method of claim 1, wherein filtering comprises removing a thermal (kT/C) signal noise from the combined output signal via a least mean squares (LMS) filter.

7. The method of claim 6, wherein the reference ADC is a successive approximation register (SAR) ADC.

8. The method of claim 1, wherein the reference ADC is configured for dynamic element matching to increase linearity of the reference ADC.

9. The method of claim 1, further comprising:
receiving the input signal at an input signal network circuit;
dividing a voltage of the input signal; and
passing the input signal to both of the first ADC and the reference ADC, wherein the input signal network circuit reduces a distortion of the signal after sampling in the reference ADC.

10. A linear reference analog to digital converter (ADC) network comprising:
a first analog to digital converter (ADC) operatively connected to a first sample and hold circuit, configured to receive an input signal from the first sample and hold circuit and sample the input signal with a harmonic distortion;
a reference ADC operatively connected to a second sample and hold circuit, configured to receive the input signal and sample the input signal with a second harmonic distortion;
a combining module operatively connected to the first ADC and the reference ADC, the combining module configured to equalize a linearity of an output of the first ADC to a linearity of an output of the reference ADC, and output a combined output signal; and
a circuit configured to output a calibrated output signal having calibrated harmonic distortion content, wherein the output of the reference ADC has greater linearity than an output of the first ADC.

11. The linear reference analog to digital converter (ADC) network of claim 10, further comprising correcting, with the first ADC and the reference ADC, a channel mismatch between the first ADC and the reference ADC.

12. The linear reference analog to digital converter (ADC) network of claim 10, wherein the output of the reference ADC comprises a thermal (kT/C) noise level greater than a thermal (kT/C) signal noise level of the output of from the first ADC.

13. The linear reference analog to digital converter (ADC) network of claim 10, wherein the reference ADC has a lower sampling rate than the first ADC by a predetermined downsampling factor.

14. The linear reference analog to digital converter (ADC) network of claim 10, wherein filtering comprises reducing a thermal (kT/C) signal noise from the combined output signal via a least mean squares (LMS) filter.

15. The linear reference analog to digital converter (ADC) network of claim 14, wherein the reference ADC is a successive approximation register (SAR) ADC.

16. The linear reference analog to digital converter (ADC) network of claim 10, wherein the reference ADC is configured for dynamic element matching to increase linearity of the reference ADC.

17. The linear reference analog to digital converter (ADC) network of claim 10, further comprising an input signal network circuit operatively connected to the reference ADC, wherein the input signal network circuit is configured to:
receive the input signal;
divide a voltage of the input signal; and
pass the input signal to both of the first ADC and the reference ADC, wherein the input signal network circuit reduces a distortion of the after sampling in the reference ADC.

18. A non-transitory computer-readable storage medium comprising program instructions that are executable by a processor to perform a method for calibrating harmonic distortion, the method comprising:
receiving an input signal at a first analog to digital converter (ADC) and a reference ADC;
equalizing, with the first ADC and the reference ADC, a linearity of an output of the first ADC to a linearity of an output of the reference ADC;
combining, with a combining module, the output of the first ADC and the output of the reference ADC to form a combined output signal; and
outputting a calibrated output signal having calibrated harmonic distortion content, wherein the output of the reference ADC has greater linearity than the output of the first ADC.

* * * * *